United States Patent
Laurell et al.

(10) Patent No.: US 6,620,331 B1
(45) Date of Patent: Sep. 16, 2003

(54) METHOD OF ETCHING AN OPENING

(76) Inventors: Thomas Laurell, Latinlinjen 9, SE-224 73 Lund (SE); Johan Drott, Spolegatan 14, SE-222 20 Lund (SE); Johan Nilsson, Ostra Kennelvägen 7, SE-237 35 Bjarred (SE); Lars Wallman, Brandstad 25, SE-270 33 Vollsjo (SE)

(*) Notice: Subject to any disclaimer, the term of this patent is extended or adjusted under 35 U.S.C. 154(b) by 0 days.

(21) Appl. No.: 09/700,044
(22) PCT Filed: May 6, 1999
(86) PCT No.: PCT/SE99/00757
  § 371 (c)(1),
  (2), (4) Date: Jan. 9, 2001
(87) PCT Pub. No.: WO99/57332
  PCT Pub. Date: Nov. 11, 1999

(30) Foreign Application Priority Data

May 6, 1998 (SE) .............................................. 9801575

(51) Int. Cl.⁷ .............................. C23F 1/02; B41J 2/16; H01L 21/302
(52) U.S. Cl. ............................... 216/2; 216/11; 216/27; 216/48; 216/62; 216/87
(58) Field of Search .............................. 216/2, 11, 27, 216/48, 62, 87

(56) References Cited

U.S. PATENT DOCUMENTS

| | | | |
|---|---|---|---|
| 5,204,690 A | 4/1993 | Lorenze, Jr. et al. | 346/1.1 |
| 5,277,754 A | 1/1994 | Hadimioglu et al. | 156/644 |
| 5,332,469 A | 7/1994 | Mastrangelo | 156/643 |
| 5,726,100 A | 3/1998 | Givens | 438/702 |
| 6,159,385 A * | 12/2000 | Yao et al. | 216/2 |
| 6,521,041 B2 * | 2/2003 | Wu et al. | 117/94 |

* cited by examiner

Primary Examiner—Anita Alanko
(74) Attorney, Agent, or Firm—Boyle Fredrickson Newholm Stein & Gratz S.C.

(57) ABSTRACT

The invention relates to a method for etching an opening, and more precisely, to etching in a silicon plate for creating a nozzle opening. According to the invention, one side of the silicon plate (1) is protected by a protective layer (2), and a recess (5) is made in the protective layer. Etching is made anisotropically through the recess so as to create a cavity (4) in the shape of a truncated pyramid of a predetermined depth in the silicon plate. The cavity is doped so as to create a doped layer (3) at the predetermined depth. The etching is then continued until the bottom surface of the cavity has passed the doped layer. Subsequently, etching is performed from the other side, while a voltage is applied to the doped layer, so as to free the nozzle opening at the other side. The invention enables an accurate control of the surface area of the nozzle opening. Through this, the amount of discharged fluid and the directional precision can be controlled very accurately.

20 Claims, 2 Drawing Sheets

METHOD OF ETCHING AN OPENING

BACKGROUND OF THE INVENTION

The present invention relates to a new method for etching an opening, and more precisely, to etching in a silicon plate for creating a nozzle opening. Such nozzle openings can be utilised in many areas, e.g. for various metering devices, in inkjet printers, etc. The invention enables accurate control of the dimensions of the nozzle opening. Through this, the amount of discharged fluid and the directional precision can be controlled very accurately.

STATE OF THE ART

It is previously known to use anisotropic etching for creating nozzle openings in silicon plates. The silicon plate is etched from one side so as to create a pyramid-shaped cavity. Then etching is performed from the other side so as to open the pyramid-shaped cavity at its tip. The etching is interrupted when the nozzle opening has reached the appropriate size.

With this previous technique there are certain problems. The surface area of the nozzle opening will be dependent on how deeply the etching is made from the other side. As a large number of nozzle openings are manufactured simultaneously from the same silicon plate, the etching must be interrupted at the same time for all the nozzles. Since the thickness of the silicon plate varies across its extension, the surface area of each individual nozzle opening will vary accordingly. The manufacturing precision will be unsatisfactory. Alternatively, a very carefully manufactured silicon plate must be used, which is costly. Furthermore, if the second side etching depth is large, the risk of the etching front having reached different depths in the plate at the time of breakthrough in the first nozzle also increases, which further increases the variation of the size of the nozzle openings.

The present invention solves this problem by, as before, etching a pyramid-shaped cavity from one side, but when the cavity has reached the depth where the intended opening is to be created, the etching is interrupted and a doping of the structured silicon surface is performed at this depth. After doping the silicon plate, the etching of the truncated pyramid cavities is continued, at least until the etching front has passed trough the doped region at the bottom of the truncated pyramid cavity. When the etching is then performed from the other side, the doped layer is given a potential in relation to a reference electrode in the etching solution, thereby protecting the doped layer from the etching solution. Since the bottom of the truncated pyramid is not doped, the etching from the other side will break through the bottom and open the nozzle. The etching can then be continued in order to free a conical nozzle rising over the silicon surface. It will be understood that this occurs independently of the thickness of the plate, as the position of the nozzle opening has already been established. Thereby, a high degree of accuracy is obtained for all nozzles across the entire silicon plate.

SUMMARY OF THE INVENTION

The present invention thus provides a method for etching an opening in a silicon plate.

According to the invention, one side of the silicon plate is protected by a protective layer, and a recess is made in the protective layer. Etching is made anisotropically through the recess so as to create a cavity in the shape of a truncated pyramid of a predetermined depth in the silicon plate. The cavity is doped so as to create a doped layer at the predetermined depth. The etching is then continued until the bottom surface of the cavity has passed the doped layer. Subsequently, etching is performed from the other side, while the etching stop in the doped layer is being activated, so as to free the nozzle opening at the other side.

The invention is defined in claim 1, whereas advantageous embodiments are stated by the dependent claims.

BRIEF DESCRIPTION OF THE DRAWINGS

The invention will be described in detail below, with reference to the appended drawings, in which.

DETAILED DESCRIPTION OF PREFERRED EMBODIMENTS

In the following description it is assumed that those specialised in the field possess knowledge of the previously commonly known types of working methods. Therefore these methods will not be discussed in detail but will only be summarised as follows.

In anisotropic etching of silicon, the fact that the orientation of the crystal planes in principle stops etching in certain defined directions, is utilised. This creates the pyramid-shaped structures that are used in e.g., the present invention.

The etching is performed with an etching solution that is anisotropic for silicon, e.g. potassium hydroxide (KOH) of an appropriate concentration and at a suitable temperature. Since the etching speed is known, the etching depth can be controlled by etching during a predetermined period of time. This provides a high accuracy.

An alternative etching technique is Deep Reactive Ion Etching (DRIE). With this technique, a cylindrical cavity with well-defined dimensions can be created. A cylindrical cavity can be used in the same manner as the pyramid-shaped cavity used in the embodiment of the invention described below.

Etching can be blocked by utilising so-called pn etching stop. A layer of silicon is n-doped with e.g. phosphorus. A positive potential is applied to the doped layer and a negative potential is applied to an electrode in the etching solution. By this polarisation, the doped area is protected from the etching. If the potential is removed, etching can be performed normally. The etching stop can thus be switched on and off as required.

An alternative etching stop technique is so-called photovoltaic electro-chemical etching stop technique. Here, the silicon is doped with p-type on n. The potential in the doped layer is generated by illumination instead of by an electrical voltage. The etching stop is thus activated by light.

The silicon plate can also be protected against the etching agent by applying a protective layer, e.g. silicon dioxide ($SiO_2$). In order to perform etching, a hole must be made in the oxide. This can be made e.g. through photo-lithographic techniques, which provide high accuracy.

Furthermore, other steps are included, such as rinsing and polishing, etc., which are well known within the trade and are not described here. The invention is also intended to cover methods equivalent to the previously known working methods mentioned above.

The method according to the invention starts by protecting one side of a silicon plate with an oxide. A well-defined hole or recess is made in the oxide. Through producing the hole with a high accuracy, the subsequent etching will produce a pyramid-shaped cavity, the dimensions of which, at predetermined depth, will also have a high accuracy.

Figure 1A:
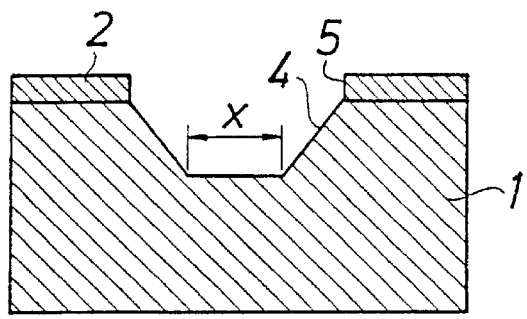
FIGS. 1a to 1f show different steps of the method according to the present invention

FIG. 1a shows the silicon plate 1 with a protective layer 2. Through the recess 5 in the protective layer, the etching has started, so as to create a cavity 4. When the etching has progressed for a predetermined period of time, it is stopped. The cavity then has a determined depth and a corresponding, accurately determined width x at the bottom. This bottom surface will later define the actual nozzle opening.

Figure 1B:
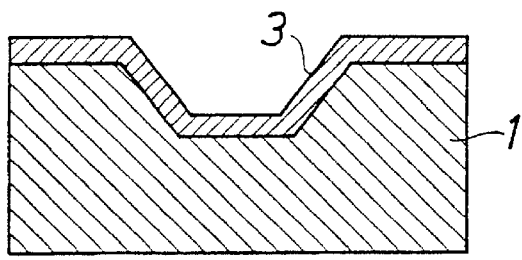

In order to be able subsequently to stop the etching at exactly this depth, a doped layer 3 is now applied, as shown in FIG. 1b. Before doping the silicon plate, the protective oxide of FIG. 1a has been removed.

Figure 1C:
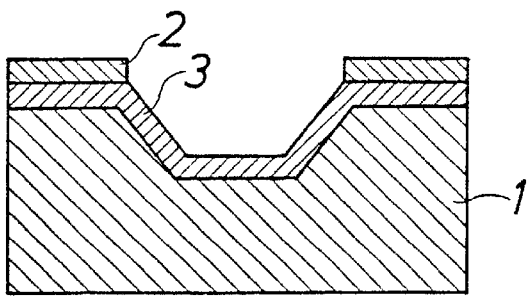

Then a thin oxide layer is again applied to the plate and recesses are made at the same locations as before, as shown in FIG. 1c.

Figure 2:
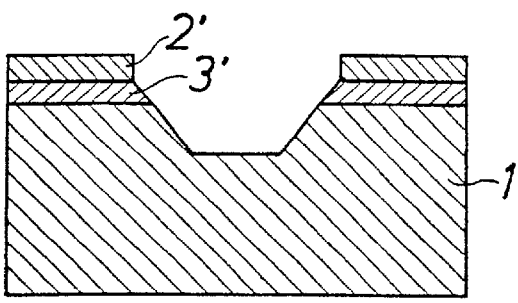
FIG. 2 shows an alternative step according to the invention.

In an alternative embodiment, the entire plate can be doped initially, and then a protective layer is applied. After creating the recess in the protective layer and etching, the structure shown in FIG. 2 is obtained, having a protective layer 2' on top and a doped layer 3' underneath. After that, doping can be performed again, creating the structure as shown in FIG. 1c.

Figure 3:
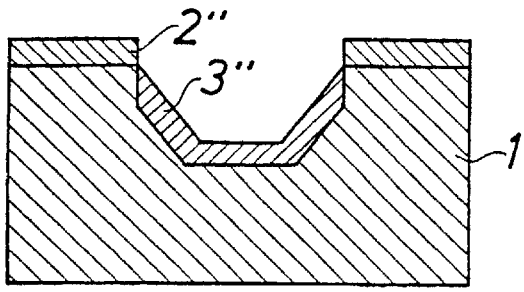
FIG. 3 shows a further alternative step according to the invention.

As a further alternative, doping can be performed directly after having stopped the first etching, to obtain the structure shown in FIG. 3. There will not then be any doped layer underneath the protective layer 2", but a doped area is not required in this location, as will be evident from the following. The doped layers 3" at the cavities are sufficient. In order to activate the doped layers 3", the photovoltaic electro-chemical etching stop technique is preferably utilised, as the doped layers 3" are not continuous from cavity to cavity.

Figure 1D:
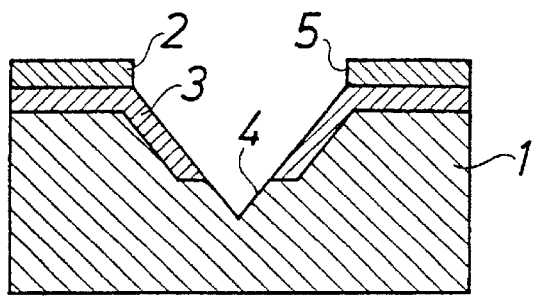

After the doping at the predetermined depth, the etching is continued from the same direction. No etching stop is activated, but the etching continues anisotropically in the same way as before, until the entire pyramid-shaped cavity is etched out to its peak, or at least until the doped region has been passed. This is shown in FIG. 1d.

Figure 1E:
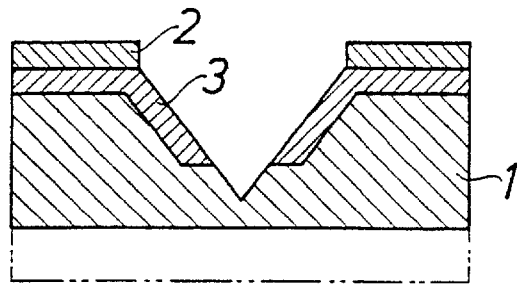

In order now to make a hole in the cavity and to create the nozzle opening, etching is performed from the other direction, i.e. bulk etching from the bottom side as shown in FIG. 1e.

Figure 1F:
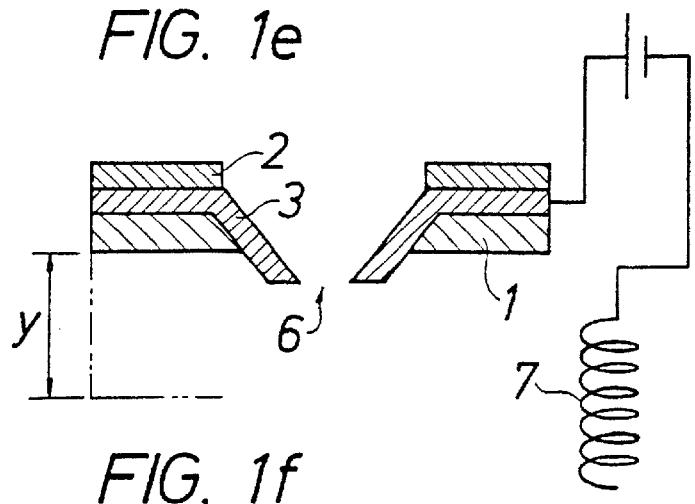

During the etching from the bottom side, the etching stop is activated e.g. by polarising the doped layer on the topside in relation to an electrode 7 in the etching solution (not shown). As was discussed earlier, the doped area will then be protected from the anisotropic etching, and a nozzle structure having a nozzle opening 6 will be left on the bottom side of the silicon plate. The bottom side etching will progress up to a distance shown as y in FIG. 1f. The distance y affects the nozzle structure only inasmuch as how far down the nozzle will extend from the bottom side of the silicon plate. This parameter is however not critical and it is of no importance that it will vary somewhat for the various nozzles created simultaneously on the plate. However, it should be pointed out that in many cases an protruding nozzle structure is advantageous compared to an opening level with a planar surface, as the protruding structure is less sensitive to variations in physical fluid parameters such as viscosity, surface tension and density. Thus, a protruding nozzle structure is desirable in most cases.

This should be compared to the previously known technique, where initially the entire pyramid-shaped cavity is etched out, and only then is the doping performed. A structure similar to FIG. 1e is then obtained, but with doping along the entire cavity (not shown). Subsequently, bulk etching from the rear side is performed, and is interrupted by applying a voltage to the doped layer when the nozzle opening is considered to have reached the correct size. It will be appreciated that the nozzle opening surface area will then be dependent of the etching length (y) with the corresponding drawbacks as discussed above.

The present invention thus provides major advantages compared to the previously known technique. The surface area of the nozzle opening can be controlled in an accurate and reproducible way. The method according to the invention requires no high tolerances of the thickness of the plate, but a cheaper raw material with thickness variations can be used without deteriorating the quality of the end product.

The invention utilises a number of known working methods, as outlined above. The invention could as well be applied with other equivalent methods. The protective scope of the application is only limited by the appended claims.

What is claimed is:

1. Method for etching an opening in a silicon plate, characterised by the steps of:
   protecting the silicon plate surface on one side with a protective layer;
   creating a well-defined recess in the protective layer;
   etching, through said recess, a cavity down to a predetermined depth in the silicon plate;
   doping said cavity so as to create a doped layer at the predetermined depth;
   continuing the etching at least until the bottom surface of the cavity has passed the doped layer;
   etching from the other side, while activating the etching stop in the doped layer, so as to free the opening at the other side.

2. Method according to claim 1, characterised by activating the etching stop through applying a protective voltage, protecting against the anisotropic etching, to the doped layer.

3. Method according to claim 1, characterised by activating the etching stop through illuminating the doped layer.

4. Method according to claim 2, characterised by the doping of the cavity comprising the steps of:
   removing the protective layer and doping the cavity;
   generating a new protective layer; and
   creating a new recess in the protective layer, through which recess the etching is to be continued.

5. Method according to claim 4, characterised by doping the silicon plate (3') before generating the first protective layer (2').

6. Method according to claim 4, characterised by the cavity being anisotropically etched in the form of a truncated pyramid, down to a predetermined depth in the silicon plate.

7. Method according to claim 4, characterised by the protective layer consisting of silicon dioxide.

8. Method according to claim 4, characterised by the recess in the protective layer being created by lithographic techniques.

9. Method according to claim 4, characterised by the depth of the cavity being determined by stopping the etching after a predetermined period of time.

10. A method of etching an opening in an etchable plate for producing a nozzle through which matter can pass, the method comprising:
 (a) providing an etchable plate having an upper surface and a lower surface opposite the upper surface;
 (b) providing a protective layer on one of the upper and lower surfaces;
 (c) forming a recess in the protective layer on the one of the upper and lower surfaces;
 (d) etching a cavity through the recess in the etchable plate, the cavity having a side surface and a bottom surface;
 (e) applying a layer of dopant on at least the cavity surfaces;
 (f) etching through the layer of dopant along the bottom surface of the cavity;
 (g) activating the layer of dopant; and
 (h) etching the etchable plate on the other one of the upper and lower surfaces while the dopant is activated until a portion of the cavity forms an opening through the etchable plate.

11. The method according to claim 10 wherein during step (h) the other one of the upper and lower surfaces is removed reducing the thickness of the etchable plate and the layer of activated dopant protrudes outwardly from the other one of the upper and lower surfaces producing a nozzle that protrudes from the etachable plate.

12. The method according to claim 10 wherein in step (d) etching occurs until the bottom surface of the cavity produced by etching has a predetermined width.

13. The method according to claim 12 wherein in step (d) etching occurs until the bottom surface of the cavity produced by etching has a predetermined depth.

14. The method according to claim 10 wherein steps (a) through (h) are performed in the order recited.

15. The method according to claim 10 further comprising the additional step of applying a first layer of dopant before (i) the protective layer is provided in step (b), (ii) before etching is performed in step (d), and (iii) before the layer of dopant is applied on the cavity surfaces step (e).

16. The method according to claim 15 wherein the first layer of dopant is disposed against one of the upper and lower surfaces of the etchable plate and between the etchable plate and the protective layer.

17. The method according to claim 10 wherein the etchable plate is comprised of silicon.

18. The method according to claim 17 wherein during step (d) anisotropic etching is performed.

19. The method according to claim 10 wherein in step (f) etching is performed into the bottom surface of the cavity until the bottom surface is removed and a pyramidal shaped cavity that has an apex is formed.

20. The method according to claim 10 wherein the layer of dopant is applied in step (e) only along the surfaces of the cavity.

* * * * *